US011137806B2

(12) United States Patent
Hutton

(10) Patent No.: US 11,137,806 B2
(45) Date of Patent: Oct. 5, 2021

(54) THERMAL MANAGEMENT OF INTEGRATED CIRCUITS

(71) Applicant: Intel Corporation, Santa Clara, CA (US)

(72) Inventor: Michael David Hutton, Mountain View, CA (US)

(73) Assignee: Intel Corporation, Santa Clara, CA (US)

(*) Notice: Subject to any disclaimer, the term of this patent is extended or adjusted under 35 U.S.C. 154(b) by 735 days.

(21) Appl. No.: 15/870,442

(22) Filed: Jan. 12, 2018

(65) Prior Publication Data

US 2019/0043737 A1    Feb. 7, 2019

(51) Int. Cl.
| | |
|---|---|
| *H01L 21/48* | (2006.01) |
| *B60H 1/22* | (2006.01) |
| *H01L 23/373* | (2006.01) |
| *B60H 1/00* | (2006.01) |
| *H01L 23/34* | (2006.01) |
| *G06F 1/20* | (2006.01) |
| *H01L 23/367* | (2006.01) |
| *G06F 1/324* | (2019.01) |
| *G06F 1/3234* | (2019.01) |
| *G06F 1/3287* | (2019.01) |

(52) U.S. Cl.
CPC ......... *G06F 1/206* (2013.01); *B60H 1/00921* (2013.01); *B60H 1/22* (2013.01); *G06F 1/20* (2013.01); *G06F 1/324* (2013.01); *G06F 1/3243* (2013.01); *G06F 1/3287* (2013.01); *H01L 21/4882* (2013.01); *H01L 23/3675* (2013.01); *H01L 23/3677* (2013.01); *H01L 23/373* (2013.01); *H01L 23/34* (2013.01)

(58) Field of Classification Search
None
See application file for complete search history.

(56) References Cited

U.S. PATENT DOCUMENTS 8,572,535 B2 * 10/2013 Rahmat ................ G06F 30/00
716/113

OTHER PUBLICATIONS

Reda "Thermal and Power Characterization of Real Computing Devices," in IEEE Journal on Emerging and Selected Topics in Circuits and Systems, vol. 1, No. 2, pp. 76-87, Jun. 2011 (Year: 2011).*
Shao et al . ("Thermal-aware DC IR-drop co-analysis using non-conformal domain decomposition methods." 2012. Royal Society of London Proceedings Series A. 468. 1652-1675.) (Year: 2012).*

* cited by examiner

*Primary Examiner* — Roy Y Yi
(74) *Attorney, Agent, or Firm* — Fletcher Yoder, P.C.

(57) ABSTRACT

A system includes a programmable logic device (PLD) and a processor. The processor determines sets of power values associated with respective portions of a plurality of portions of the PLD. The processor also determines a temperature value for each portion of the plurality of portions based on the sets of power values and platform data associated with the PLD. Additionally, the processor generates a power map indicative of an expected amount of power for each portion of the plurality of portions based on the sets of power values. Furthermore, the processor generates a heat map indicative of an expected temperature value for each portion of the plurality of portions.

20 Claims, 12 Drawing Sheets

THERMAL MANAGEMENT OF INTEGRATED CIRCUITS

BACKGROUND

The present disclosure relates generally to managing integrated circuits to prevent overheating. More specifically, the present disclosure relates to systems and methods for actively monitoring temperature and power of an integrated circuit and controlling operations of the integrated circuit based on the monitored temperature and power.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Programmable logic devices are a class of integrated circuits that can be programmed to perform a wide variety of operations. When the temperature of a programmable logic device exceeds an operating temperature of the programmable logic device, overheating occurs. As with other electronic devices, overheating may decrease the performance of a programmable logic device, and, in some cases, may damage the programmable logic device or its components.

In some cases, a temperature sensor may be used to detect temperature associated with the programmable logic device. However, temperature sensors generally detect a temperature associated with a specific area of the programmable logic device. Temperatures associated with other areas of the programmable logic device may differ from that of the temperature of the area served by the temperature sensor, making it difficult to identify overheating in those other areas of the programmable logic device.

BRIEF DESCRIPTION OF THE DRAWINGS

Advantages of the disclosure may become apparent upon reading the following detailed description and upon reference to the drawings in which.

DETAILED DESCRIPTION OF SPECIFIC EMBODIMENTS

Figure 1:
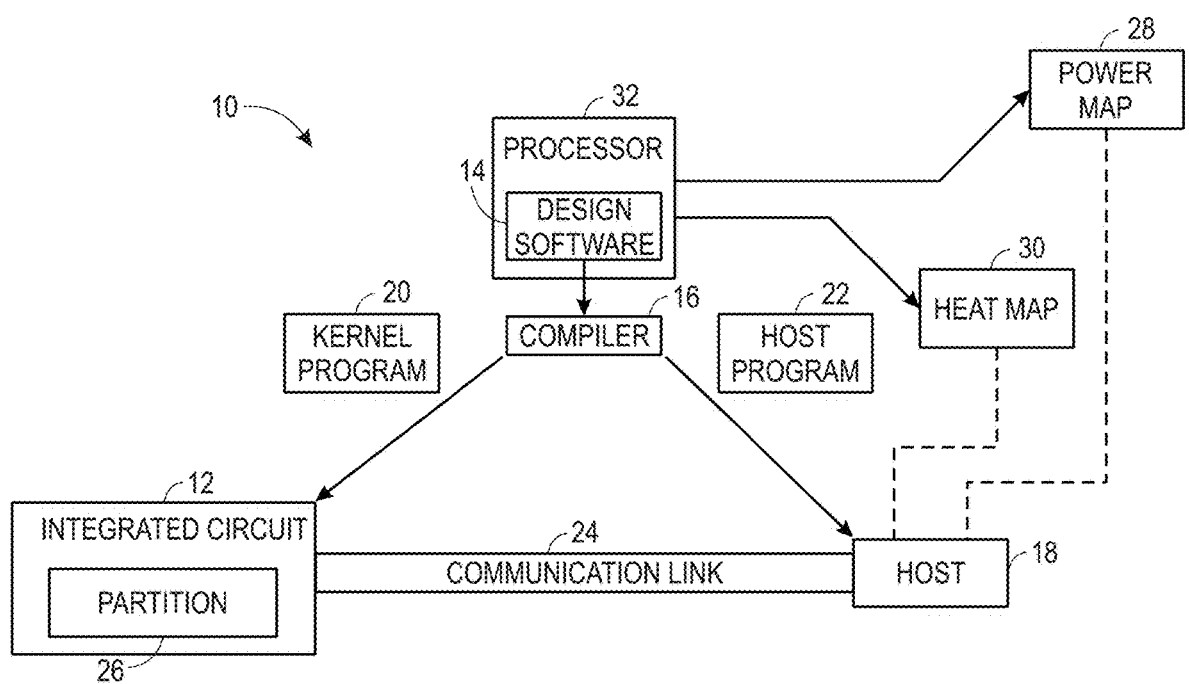
FIG. 1 is a block diagram of a system that may generate a power map and a heat map of an integrated circuit and control the integrated circuit using the power and heat map, in accordance with an embodiment of the present disclosure.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

This disclosure generally relates to controlling operations of integrated circuits. More specifically, power maps and heat maps of integrated circuits may be generated and refined (i.e., updated), such that they are utilized to control the operation of the integrated circuits. Undesired power levels or temperatures may cause overheating, which can compromise performance of integrated circuits or damage integrated circuits or components thereof. For example, certain levels of power or overheating may cause configuration random access memory that stores values of a programmable logic device fabric to store incorrect values or lose stored values, which can affect operation of the integrated circuit.

With the foregoing in mind, in some embodiments, a controller or other suitable device may receive temperature data via temperature sensors disposed on certain portions of the integrated circuit. In addition, the controller may receive power data from accelerator functional units (AFUs), voltage regulators, and the like of the integrated circuit. Based on the data acquired by these components and other known information (e.g., transceiver configuration, incidence coefficient matrix, AFU slot size and population), the controller may determine the temperature and power of different portions of the integrated circuit more accurately. In one embodiment, the controller may use the determined temperature and power properties of various portions of the integrated circuit to generate heat and power maps associated with the integrated circuit.

To detect portions of integrated circuits that are utilizing an undesirable amount of power and/or operating at an undesirable temperature, the controller may consult the heat and power maps of the integrated circuit to manage operations of the integrated circuit. That is, by utilizing the heat and power maps, the controller may adjust operations of the integrated circuit to reduce or prevent the integrated circuit from drawing an excessive amount of electrical power and from overheating in any particular region.

With the foregoing in mind, FIG. 1 illustrates a block diagram of a system 10 that may generate a power map and a heat map of an integrated circuit 12. The designer may specify a program or circuit design to be implemented, such as an OpenCL program, which may enable the designer to more efficiently and easily provide programming instructions to implement a set of programmable logic for the integrated circuit 12 without requiring specific knowledge of certain computer programming languages (e.g., Verilog or VHDL).

In certain embodiments, designers may implement their circuit designs using design software 14, such as a version of Quartus by Intel Corporation™. The design software 14 may use a compiler 16 to convert the program into a machine-readable instructions representative of the program provided to the design software 14 to a host 18 and the integrated circuit 12. For example, the integrated circuit 12 may receive one or more kernel programs (bitstreams) 20, which describe the hardware implementations that should be stored in the integrated circuit 12. The host 18 may receive a host program 22 which may be implemented by the kernel programs (bitstreams) 20. To implement the host program 22, the host 18 may communicate instructions from the host program 22 to the integrated circuit 12 via a communications link 24, which may be, for example, direct memory access (DMA) communications or peripheral component interconnect express (PCIe) communications. In some embodiments, the kernel programs (bitstreams) 20 and the host 18 may enable configuration and/or partial reconfiguration of a partition 26 on the integrated circuit 12. The partition 26 may be a region on the integrated circuit 12 with adaptable logic that may facilitate configuration and/or partial reconfiguration of the integrated circuit 12, such that certain functionalities may be added, removed, and/or swapped before and/or during the runtime of the integrated circuit 12. For example, the integrated circuit 12 may be a programmable logic device (PLD), and the partition 26 may be a region of the integrated circuit 12 that can be configured by an end-user of the integrated circuit 12.

The design software 14 may also be used by the designers to generate power maps 28 and heat maps 30 of the integrated circuit 12. More specifically, a processor 32 that may process (e.g., send to compiler 16) the design software 14 may generate the power maps 28 and heat maps 30 based on the hardware implementations of the integrated circuit 12 as specified in the design software 14. For instance, the power maps 28 and heat maps 30 may respectively pertain to expected power consumption and expected temperatures of portions of the integrated circuit 12, and the expected power consumption and temperatures may be determined based on a hardware implementation to be employed by the integrated circuit 12. For example, the power maps 28 and heat maps 30 may respectively provide estimations of power and temperature values associated with each sector of a sectorized FPGA or for virtual regions of the integrated circuit 12, such as portions of the partition 26 that may be defined by an end-user. Additionally, the host 18 may receive power maps 28 and heat maps 30 that the processor 32 generates.

Figure 2:
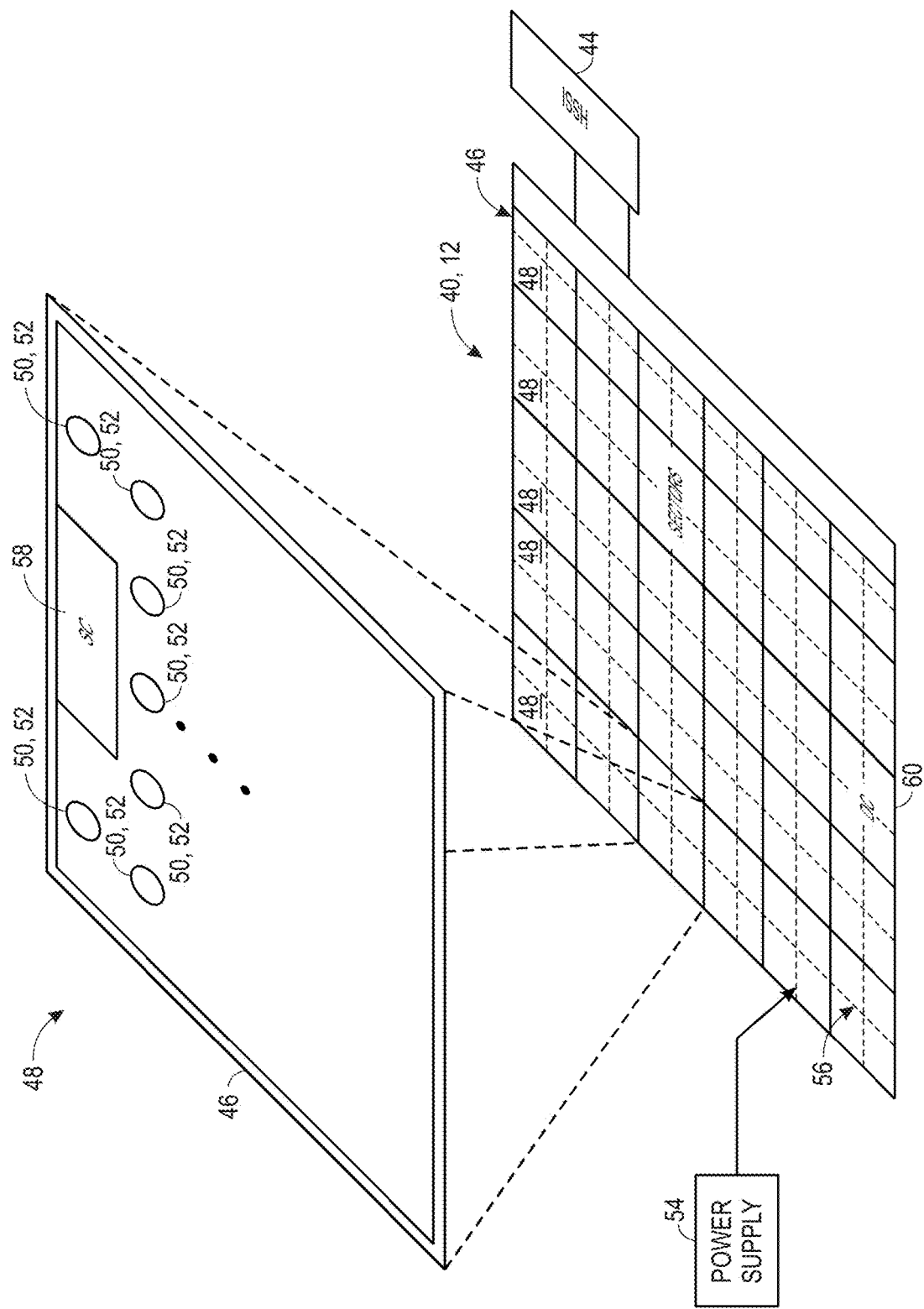
FIG. 2 is a block diagram of an integrated circuit that includes multiple sectors of programmable logic, in accordance with an embodiment of the present disclosure.

The integrated circuit 12 may be a programmable logic device, such as a field programmable gate array (FPGA) 40, as shown in FIG. 2. For the purposes of this example, the FPGA 40 is referred to as an FPGA, though it should be understood that the device may be any suitable type of programmable logic device (e.g., an application-specific integrated circuit and/or application-specific standard product). In one example, the FPGA 40 is a sectorized FPGA of the type described in U.S. patent application Ser. No. 14/460,548, "Programmable Circuit Having Multiple Sectors."

In the example of FIG. 2, the FPGA 40 may include transceiver circuitry 44 for driving signals off of the FPGA 40 and for receiving signals from other devices. Interconnection resources 46 may be used to route signals, such as clock or data signals, through the FPGA 40. The FPGA 40 of FIG. 2 is sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. In some embodiments, different voltages or currents may be supplied to different sectors 48 or regions (e.g., groups of one or more sectors 48) of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50 to 100 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60, and may read data from and write data into its configuration memory 52 based on control signals from the device controller 60. In addition to these operations, the sector controller 58 may be augmented with numerous additional capabilities.

The sector controllers 58 and the device controller 60 may be implemented as state machines and/or processors. For example, each operation of the sector controllers 58 or the device controller 60 may be implemented as a separate routine in a memory that includes a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as RAM, the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40, such as commands initiated by the processor 32. To support this communication, the interconnection resources 46 may act as a network between the device controller 60 and each sector controller 58. The interconnection resources 46 may support a wide variety of signals between the device controller 60 and each sector controller 58. For example, these signals may be transmitted as communication packets.

The FPGA 40 may be electrically programmed. With electrical programming arrangements, the programmable logic elements 50 may include one or more logic elements (wires, gates, registers, etc.). For example, during programming, configuration data may be loaded into the configuration memory 52 using input/output pins and input/output circuitry. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to the gates of metal-oxide-semiconductor (MOS) transistors that control the states of the programmable logic elements 50 or programmable components of the interconnection resources 46.

Figure 3:
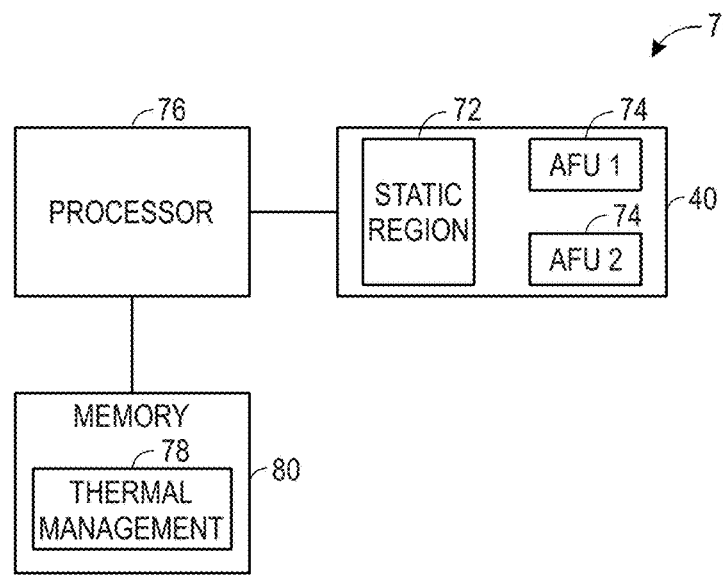
FIG. 3 is a block diagram of a system that may refine power maps and heat maps of an integrated circuit, in accordance with an embodiment of the present disclosure.

As discussed above, the integrated circuit 12 may receive one or more kernel programs (bitstreams) 20 that are implemented onto the integrated circuit 12. Keeping this in mind, FIG. 3 is a block diagram of a system 70 that may be used to refine power maps 28 and heat maps 30 as well as control the integrated circuit using the power maps 28 and heat maps 30. The regions may correspond to the kernel programs (bitstreams) 20. For example, the integrated circuit 12 (e.g., FPGA 40) may include a static region 72 and several partial reconfiguration regions 74. While the illustrated embodiment shows a single static region 72 and two partial reconfiguration regions 74, it should be noted the integrated circuit 12 may include any suitable number of static regions 72 and partial reconfiguration regions 74. The regions (e.g., static region 72 and partial configuration regions 74) of the integrated circuit 12 may be programmed and/or designed by various parties. For example, the regions may be programmed and/or designed by the maker of the integrated circuit 12, the user (i.e., user-defined), a third-party, or a combination thereof. The static region 72 corresponds to area on the integrated circuit 12 that is typically not configured to be reconfigured (i.e., reprogrammed). The partial reconfiguration regions 74 correspond to areas on the integrated circuit 12 that can be modified (i.e., partially reconfigured) to implement new logic.

The various regions of the integrated circuit 12 may correspond to different functions associated with the integrated circuit 12. For example, in the illustrated embodiment, the static region 72 is associated with control functions associated with the integrated circuit 12. For instance, the static region 72 may interface with another processor 76 that controls the integrated circuit 12 and/or other integrated circuits. It should be noted that the processor 76 differs from the processor 32 of FIG. 1 in that while the processor 32 may execute the design software 14 and generate the power map 28 and heat map 30, the processor 76 may control operation of the FPGA 40 after a kernel program (bitstream) 20 has been implemented on the FPGA 40. As discussed below, the processor 76 may also update the power map 28 and heat map 30. Additionally, in the illustrated embodiment, the partial reconfiguration regions 74 correspond to accelerator functional units (AFUs), which may be utilized to perform designated functions. For example, each of the partial reconfiguration regions 74 may perform certain calculations that are defined by a user via the design software 14.

As additionally illustrated, the processor 76 is communicatively coupled to memory 78 that includes thermal management instructions 80 that are executable by the processor 76. The thermal management instructions 80 may include power maps 28 and heat maps 30 of the integrated circuit 12 (e.g., power and heat maps 28 and 30 generated via execution of the design software 14) as well as instructions regarding how the processor 76 should manage the integrated circuit 12 based on the power and heat maps 28 and 30. For instance, based on the thermal management instructions 80, the processor 76 may determine which partial reconfiguration region 74 should be allocated to perform a calculation. Additionally, the processor 76 may refine (e.g., update, modify) power maps 28 and heat maps 30 over time. For instance, a power map 28 and a heat map 30 may be generated before the FPGA 40 implements the kernel programs (bitstreams) 20 stored on the memory 78 (e.g., within the thermal management instructions 80), and the processor 76 may alter the power and heat maps 28 and 30 based on the FPGA 40 after a hardware configuration has been implemented onto the FPGA 40. Generation and refinement of the heat maps 28 and power maps 30 are discussed in greater detail below.

Figure 4:
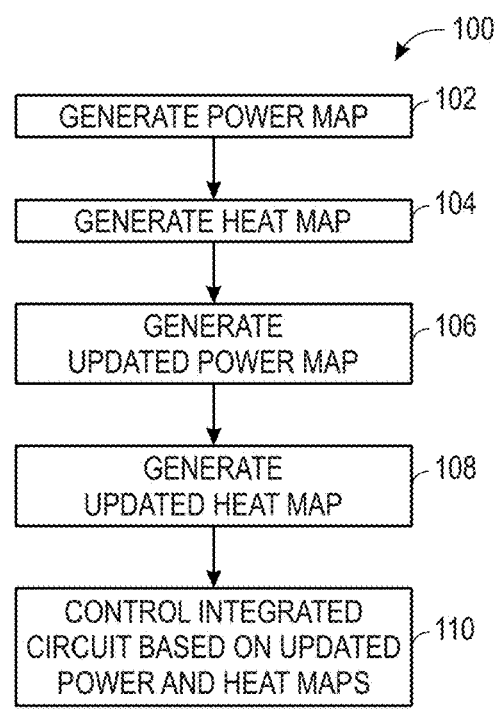
FIG. 4 is a flow chart of a process of controlling an integrated circuit based on the power maps and the heat maps, in accordance with an embodiment of the present disclosure.

With the foregoing in mind, FIG. 4 is a flow chart of a process 100 for controlling an integrated circuit (e.g., integrated circuit 12 of FIG. 1 or FPGA 40 of FIG. 2). The process 100 may be performed by a combination of the processors 32 and 76 by respectively executing the design software 14 and the thermal management instructions 78. Additionally, before proceeding to discuss the process 100 in greater depth, it should be noted that the process 100 provides a general technique that is elaborated upon below in FIGS. 5-12. That is, FIG. 4 and the process 100 are intended to provide an overview of features of the present disclosure, and more detail regarding elements of the process 100 is provided following the discussion of the process 100.

At block 102, the processor 32 generates a power map 28 of the FPGA 40. In one embodiment, the power map 28 is generated based on characteristics of the FPGA 40 as well as other factors, such as characteristics of a system in which the FPGA 40 is included. Additionally, the power map 28 may be specific to each sector 48 of the FPGA 40. Moreover, the power map 28 may be generated before at least a portion of the kernel program (bitstream) 20 is implemented on the FPGA 40. Additional details with regard to generating the power map 28 will be described below with reference to FIG. 5.

At block 104, the processor 32 generates a heat map 30. The heat map 30 may provide an expected temperature for each sector 48 of the FPGA 40, and the heat map 30 may be generated based at least partially on the power map 28 generated at block 102. As with the power map 28, the heat map 30 may be generated before at least a portion of the kernel program (bitstream) 20 is implemented on the FPGA 40. In other words, blocks 102 and 104 may be performed prior a hardware implementation defined the kernel program (bitstream) 20 is implemented on the FPGA 40. Additional details with regard to generating the heat map 30 will be described below with reference to FIG. 5.

At block 106, the processor 76 generates an updated power map. For instance, after the program (bitstream) 20 has been implemented by the FPGA 40, the processor 76 may receive data regarding operation of the FPGA 40 and refine or otherwise modify the power map 28 generated at block 102. Similarly, at block 108, the processor 76 may generate an updated heat map that may be based on the updated power map and the heat map 30. The updated heat map may be modified version of the heat map 30 generated at block 84, and the updated heat map may be generated based on how the FPGA 40 operates after the kernel program (bitstream) 20 is implemented.

At block 110, the processor 76 may control the FPGA 40 using the updated power map and the updated heat map. For instance, as described below, the processor 76 may receive data regarding operation of the FPGA 40. Utilizing the data and the updated power and heat maps, the processor 76 may determine whether the power or temperature of a portion of the FPGA 40 is undesirable (e.g., exceeds a threshold value), in which case the processor 76 may send commands to alter how the FPGA 40 is operating, among other actions.

Figure 5:
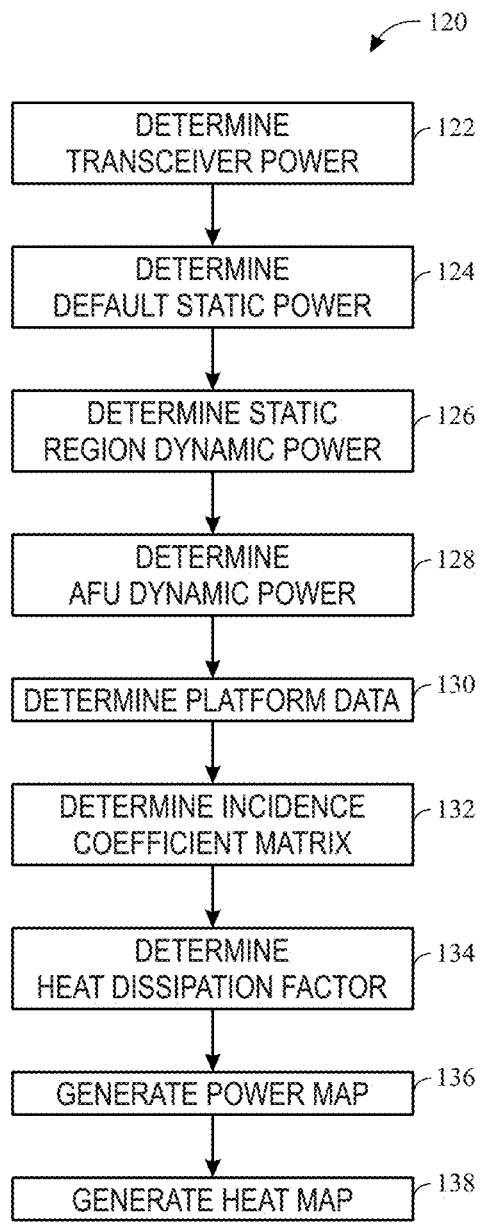
FIG. 5 is a flow chart of a process for generating a power map and a heat map of an integrated circuit, in accordance with an embodiment of the present disclosure.

Keeping the discussion of blocks 102 and 104 in mind, FIG. 5 is a flow chart of a process 120 for generating the power map 28 and a heat map 30 of an integrated circuit such as the integrated circuit 12 or the FPGA 40. The process 120 may be performed by the processor 32 by executing the design software 14 stored on the memory 24. Additionally, the process 120 may be performed prior to implementing the kernel program (bitstream) 20 onto the FPGA 40. Furthermore, before proceeding, it should be noted that details of the process 120 are explained below by referencing FIGS. 6-10.

Figure 6:
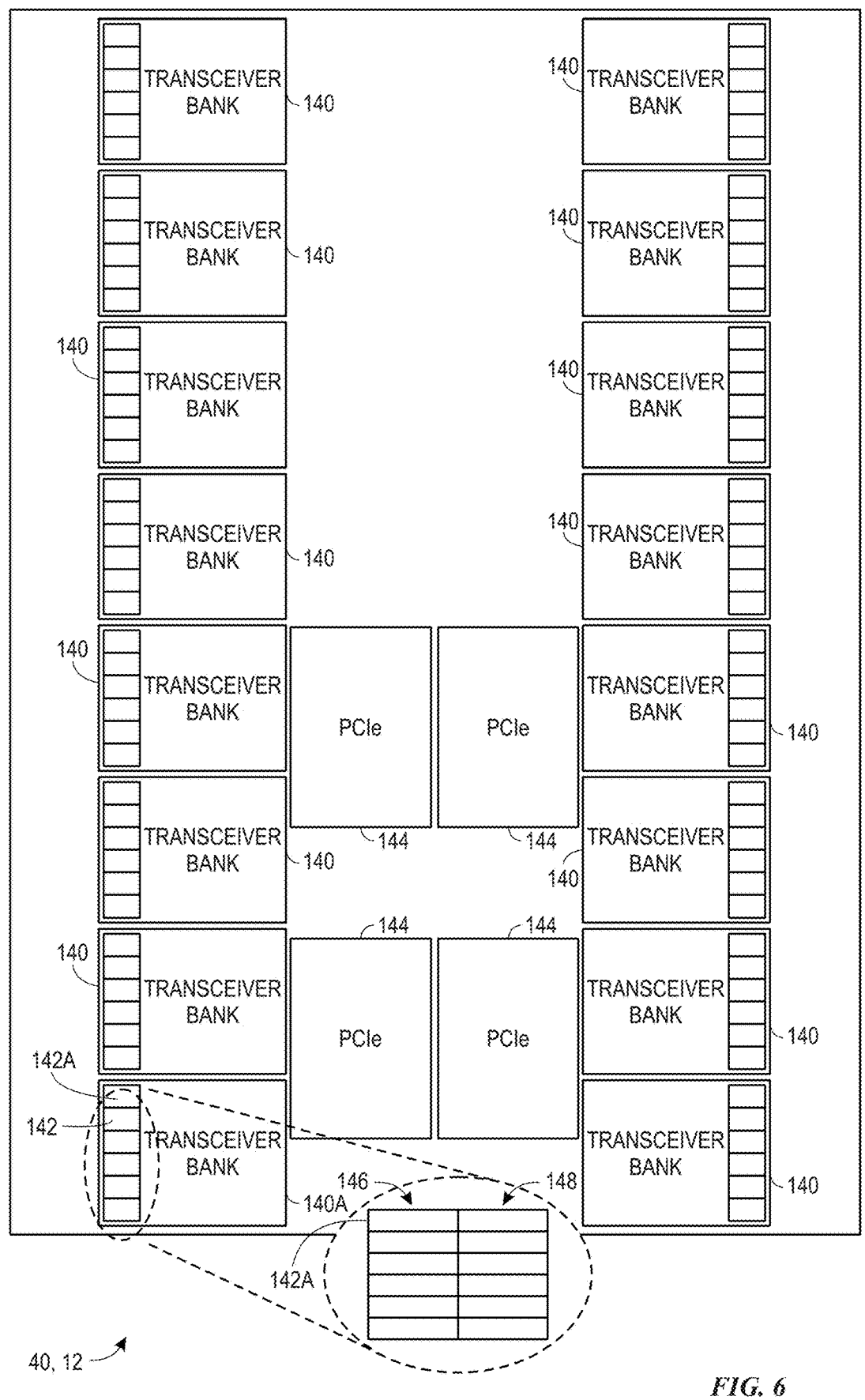
FIG. 6 is a schematic diagram of a portion of an integrated circuit, in accordance with an embodiment of the present disclosure.

At block 122, the processor 32 determines transceiver power of the integrated circuit 12. Transceiver power includes expected power consumed by transceivers (e.g., transceiver banks) of the integrated circuit 12. Referring now to FIG. 6, which is a schematic diagram of a portion of an embodiment of the FPGA 40 (and the integrated circuit 12), the FPGA 40 includes sixteen transceiver banks 140. In other embodiments, the FPGA 40 may include fewer or more transceiver banks 140. Each of the transceiver banks 140 includes six channels 142 that may be used for communication between the FPGA 40 and other devices such as the processor 76. In other embodiments of the FPGA 40, the transceiver banks 140 may include fewer or more than six channels 142 (e.g., one, two, three, four, five, seven, or more channels 142). Additionally, the channels 142 may allow for several communications to be undertaken in various manners and/or components of the system 70. For instance, some of the channels 142 may be used for Ethernet communication, communication with the PCIe blocks 144, and/or communication with the processor 76.

In addition to the transceivers 140, the FPGA 40 includes four Peripheral Component Interconnect Express (PCIe) blocks 144, which may also be utilized to allow the FPGA 40 to communicate with components that may be included in the system 70, such as the processor 76 or memory. While the illustrated embodiment of the FPGA 40 includes four PCIe blocks 144, other embodiments of the FPGA 40 may include fewer or more than four PCIe blocks 144 (e.g., one, two, three, five, or more).

The processor 32 may determine transceiver power by executing the design software 14. For example, the design software 14 may include data regarding various operations to be performed by the FPGA 40, the collection of circuit components (e.g., logic elements) used by the FPGA 40, a number of transceivers (e.g., transceiver blocks 140) that may be included in the FPGA 40, and the like. Based on a hardware implementation adopted by the FPGA 40 in accordance with the provided design, the processor 32 may determine which transceiver block 140 and PCIe blocks 144 will be implemented in the FPGA 40. The processor 32 may then determine an expected amount of power to be consumed by the transceiver blocks 140 and the PCIe blocks 144. For instance, power consumption values associated with the type of transceiver block 140 or manner of communication (e.g., via Ethernet communication, PCIe communication) used by transceiver blocks 140 may be specified by the design software 14, and the processor 32 may calculate the transceiver power using these power consumption values and the corresponding number of transceiver blocks 140, communication mediums, PCIe blocks 144, and the like of the FPGA 40.

More specifically, the processor 32 may determine power consumption values for each channel 142 of the transceiver blocks 140. For instance, based on a circuit design of the FPGA 40 provided to the design software 14, the processor 32 may determine how many channels 142 of the transceiver blocks 140 will be used for different types of communication. Additionally, the processor 32 may determine the transceiver power based on the number of channels 142 that will be used for each type of communication as well as the amount of power expected to be consumed when a channel 142 is using a particular type of communication. In other words, different amounts of power (e.g., varying amounts of milliwatts) may be associated with different methods of communication (e.g., via PCIe or Ethernet communication), and the processor 32 may determine an amount of power for each channel 142 based on the type of communication to be used. The transceiver power may then be determined by summing all of the power consumption values associated with each channel 142.

Additionally, power consumption for each channel may be categorized into digital and analog power. For instance, the processor 32 may generate a table that indicates digital power associated with the channels 142 of transceiver bank 140A in column 146 and analog power associated with the channels 142 in column 148. The digital and analog power consumption associated with each channel 142 of a respective transceiver bank 140 may then be determined by summing entries from each of the columns 146 and 148.

Figure 7:
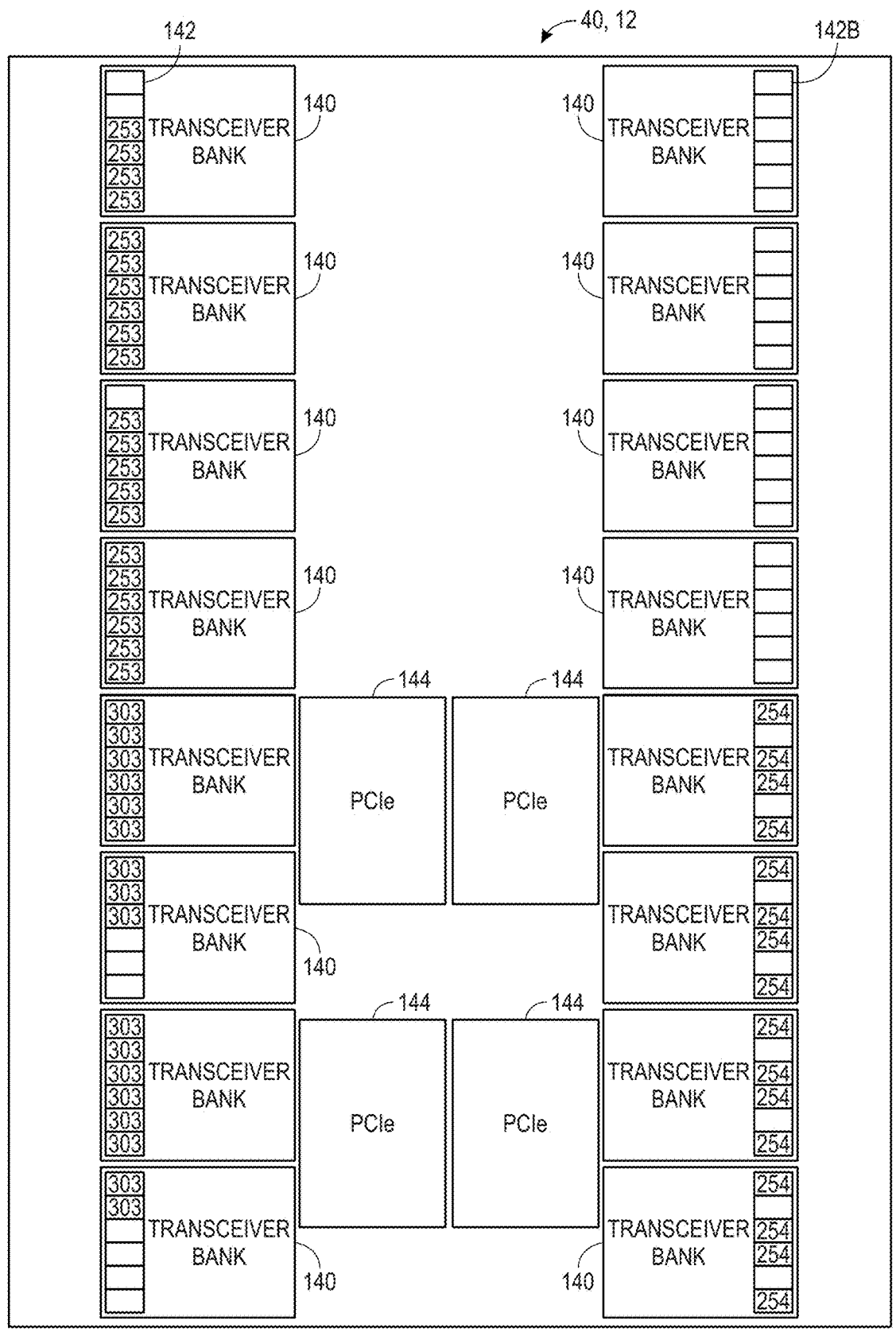
FIG. 7 is a portion of an integrated circuit that includes power values associated with channels and of transceiver blocks of an integrated circuit, in accordance with an embodiment of the present disclosure.

To further illustrate the transceiver power determination (i.e., the determination performed at block 122), FIG. 7 is provided. FIG. 7 is a diagram of a portion of an embodiment the FPGA 40 that shows power values (e.g., "252", "253", and "303") associated with the channels 142 of the transceiver blocks 140. As described above, the various power consumption values may be associated with a type of communication used by a given channel. In the illustrated embodiment, the power values are associated with Ethernet communication, PCIe communication, and communication via a processor interconnect, such as Intel® Ultra Path Interconnect (Intel® UPI). Channels 142 that do not include power values (e.g., channel 142B) correspond to channels 142 that are not expected to be used. In any case, as discussed above, the processor 32 may determine power consumed by a respective transceiver bank 140 by summing the power consumption values associated with the channels 142.

Returning to FIG. 5, at block 124, the processor 32 may determine a default static power associated with the integrated circuit 12 (e.g., the FPGA 40). Static power may refer to an amount of power used by the portions of the FPGA 40 other than the partial reconfiguration regions 74. For instance, static power includes power used by the transceiver blocks 140 and static region 72. However, because transceiver power may be calculated at block 122, the processor 32 may not calculate or recalculate power associated with the transceiver blocks 140 at block 124. In other words, in some embodiments, at block 124, the processor 32 may determine an amount of power associated with the static region 74 but not the transceiver blocks 140.

Figure 8:
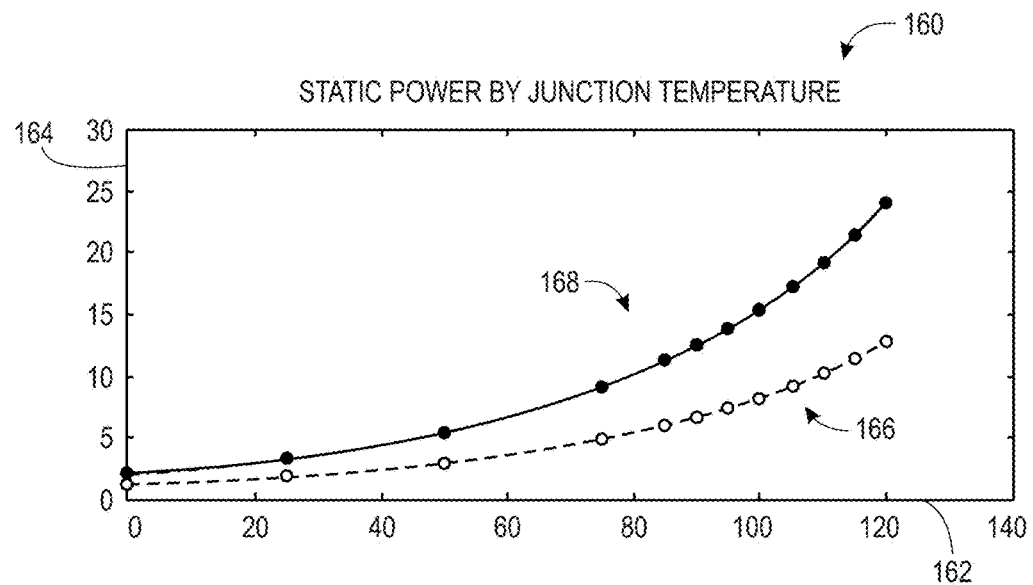
FIG. 8 is a graph showing static power of an integrated circuit as a function of junction temperature, in accordance with an embodiment of the present disclosure.

In some embodiments, the static power may be determined as a function of junction temperature of the FPGA 40. For instance, FIG. 8 is a graph 160 showing static power of the FPGA 40 as a function of junction temperature. Axis 162 includes junction temperature values (in degrees Celsius), and axis 164 includes power values (in watts) for the FPGA 40. The graph 160 includes data for two possible scenarios. Line 166 is representative of an expected operation of the FPGA 40. In other words, the data reflected by the line 166 is indicative of a static power that is expected to occur based on historical data, expected operations of the components of the FPGA 40, simulations of the operations of the FPGA 40, and the like. On the other hand, line 168 is representative of an expected static power consumed when the FPGA 40 is operating under a maximum power consumption condition, which may be specified by the manufacturer of the FPGA 40.

The data presented in the graph 160 may be provided to the design software 14, and the processor 32 may determine the expected static power consumed by the FPGA 40 using such data. Additionally, based on the static power determined for the entire FPGA 40, the processor 32 may determine an expected static power associated with each sector 48 of the FPGA 40. For instance, the static power associated with each sector 48 at a given junction temperature may be determined by dividing the power value indicated by the graph 160 for that junction temperature by the number of sectors 48 of the FPGA 40. As such, the processor 32 may determine an expected amount of static power for the FPGA 40 as well as an expected amount of static power for each sector 49 of the FPGA 40.

Referring back to FIG. 5, at block 126, the processor 32 may determine an amount of dynamic power associated with the static region 72 of the FPGA 40. Dynamic power may refer to an amount of power used when an integrated circuit (e.g., integrated circuit 12, FPGA 40) is actively operating. For example, dynamic power of the FPGA 40 refers to power consumed by the FPGA 40 when the FPGA 40 is performing calculations. The dynamic power associated with the static region 72 is the amount of power used by the static region 72 during dynamic operation of the FPGA 40.

More specifically, the processor 32 may determine an amount of dynamic power associated with the static region 72 based on the kernel program (bitstream) 20. For example, the processor 32 may determine a hardware implementation to be incorporated by the static region 72 and estimate an amount of power that such a hardware implementation would use while the FPGA 40 is dynamically operating (e.g., performing calculations). For instance, the kernel program (bitstream) 20 may include a netlist, which is a list of the electrical components of the FPGA 40 and the nodes to which the components are connected. For example, some components (e.g., logic elements) of the FPGA 40 may receive power from one or more voltage sources (e.g., power rails). As such, the processor 32 may determine an estimated amount of dynamic power based on the components of the FPGA 40 and the connections of the components. For instance, power may be determined using the following formula:

$$P = CV^2 F\alpha \qquad (1)$$

where P is power, C is capacitance, V is voltage, F is frequency, and $\alpha$ is an activity factor. The processor 32 may determine values for C, V, and F based on the kernel program (bitstream) 20. For example, these values may be defined based on the circuit components or elements used to implement the kernel program (bitstream) 20. The activity factor (i.e., $\alpha$) is a multiplier that is used to take into account how active or inactive the FPGA 40 is expected to be while operating. The processor 32 may determine the value of a based on designer input. For example, a user may specify a value of a while designing the kernel program (bitstream) 20. In some embodiments, the value of a may be determined based on answers to questions presented to the designer. For example, questions regarding an expected usage of the FPGA 40 (e.g., what calculations the FPGA 40 will be used to execute) may be presented to the designer while he or she is designing software (e.g., kernel program (bitstream) 20) of the FPGA 40.

The processor 32 may also estimate the dynamic power of each sector 48 of the static region 72 in a similar manner as described above. Additionally, the power values for each sector 48 may be included in the powers maps 28 generated by the processor 32. With this in mind, FIG. 9 includes an embodiment of the power map 28 and a diagram of an embodiment of the FPGA 40. The illustrated power map 28 is a spreadsheet representative of the sectors 48 of the FPGA 40. For example, cells of column 192 and 194 corresponds to transceiver blocks 140. Cells in columns 196 and 197 as well as cells that are included in a group 198 of cells correspond to the sectors 48 of the static region 72.

Referring back to FIG. 5, at block 128, the processor 32 may determine dynamic power associated with the partial reconfiguration regions 74. In general, the processor 32 may determine the dynamic power of the partial reconfiguration regions 74 similarly to how the dynamic power of the static region 72 is determined at block 126. More specifically, the processor 32 may determine a number and position of partial reconfiguration regions 74 of the FPGA 40 based on the kernel program (bitstream) 20. For instance, FIG. 10 includes diagrams of several embodiments of the FPGA 40. Each of the illustrated embodiments includes at least one partial reconfiguration region 74. While three examples are provided in FIG. 10, it should be noted that, in other embodiments, the FPGA 40 may include a different number of partial reconfiguration regions 74 (e.g., four or more), and the location of the partial reconfiguration regions 74 on the FPGA 40 may differ from the illustrated embodiments.

Additionally, based on the kernel program (bitstream) 20, the processor 32 may determine an estimate for dynamic power of each sector 48 the partial reconfiguration regions 74 of the FPGA 40. For example, as explained above, the kernel program (bitstream) 20 may include a netlist. Based on the netlist, the processor 32 may determine power as described above for the sectors 48 of the FPGA 40 that are included in the partial reconfiguration regions 74. That is, using Formula 1, the processor 32 may determine an estimated amount of dynamic power based on the components of the FPGA 40 and the connections of the components as described by the netlist. It should be noted that the value for a used in the calculation of the dynamic power of the partial reconfiguration regions 74 may differ from the value of a used in the calculation of the dynamic power of the static region 72.

Figure 11:
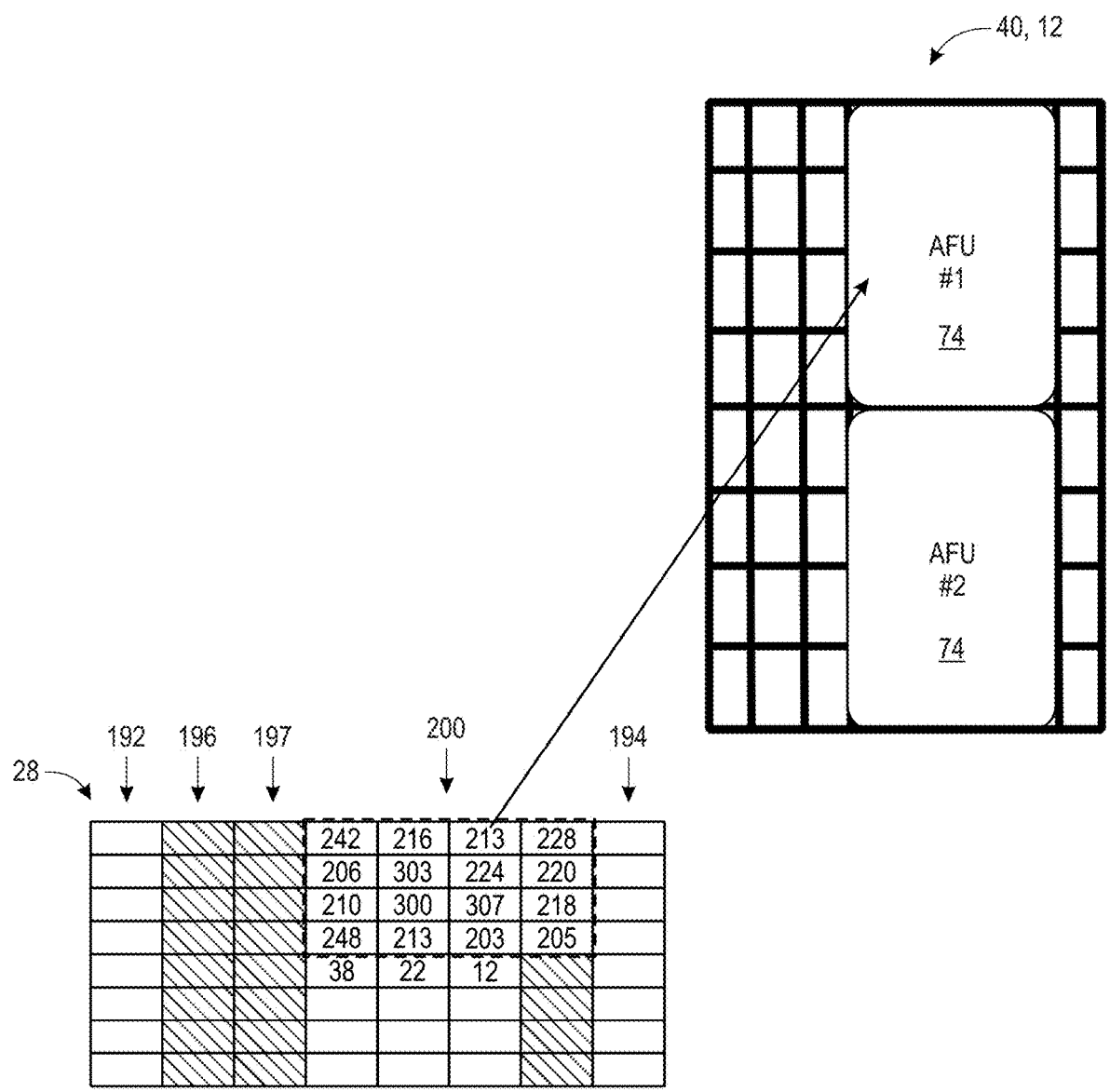
FIG. 11 is a diagram of a power map and its relationship to an integrated circuit, in accordance with an embodiment of the present disclosure.

For instance, FIG. 11 includes an example power map 28 and a diagram of an embodiment of the FPGA 40 that includes two partial reconfiguration regions 74. The power map 28 of FIG. 11 includes a region 200 of cells that correspond to the sectors 48 of one of the partial reconfiguration regions 74 (e.g., AFU 1). In other words, amounts of power for various portions of the power map 28 may be determined for each of the partial reconfiguration regions 74. Indeed, in some cases, the value of α of Formula 1 may differ between different partial reconfiguration regions 74.

It should be noted that each portion of the power map 28 that corresponds to a partial reconfiguration region 74 may be parameterized by various metrics, such as frequency (i.e., f) and the activity factor (i.e., α). Different partial reconfiguration regions 74 present in combination in the same device, or different partial reconfiguration regions 74 residing in the same area of a programmable logic device (e.g., FPGA 40) at different times may have different frequencies, different usage of resources, and different activity factors. The design software 14 is aware of these differences such as differences in usage of resources and frequency. Moreover, the activity factor associated with a particular partial reconfiguration region 74 may be obtained from user input or empirical testing conducted with the particular partial reconfiguration region 74 in isolation.

In addition to dynamic power associated with each sector 48 of the FPGA 40 (e.g., sectors 48 of the static region 72 or partial reconfiguration regions 74), the processor 32 may also determine power consumed by each voltage source to be utilized by the FPGA 40. For instance, the various sectors 48 of the FPGA 40 may receive electric power via one or more power rails. The processor 32 may determine power to be consumed from each of the power rails based on the netlist and the power determinations described above. For example, the processor 32 may determine which sectors 48 are supplied with power from a particular voltage rail, and the processor 32 may determine the power supplied by the voltage rail by summing the power associated with those sectors 48.

Furthermore, the processor 32 may determine the total amount of power consumed by the FPGA 40. Such a determination may be made by summing power consumption values. For instance, the total power consumed by the FPGA 40 may be determined by summing the power consumption values of each cell of the power map 28.

Furthermore, it should also be noted that the power map 28 may be generated for a specific junction temperature of the FPGA 40 or the integrated circuit 12. In other words, different power maps 190 may be generated for different junction temperatures. For instance, the power map 28 may correspond to power consumption values for one junction temperature, while other power maps may correspond to other junction temperatures.

Referring back to FIG. 5, at block 130, the processor 32 may determine platform data associated with system 70. Platform data includes information regarding a nature or type of integrated circuit 12 (e.g., FPGA 40) and the processor 76 being used. For instance, the platform data may include data regarding specific models of integrated circuits, processors, and hardware used in combination with the integrated circuit 12, FPGA 40, or processor 76. The platform data may be obtained based on user input from the designer during the design of the hardware implementation to be incorporated on the FPGA 40.

With respect to the integrated circuit 12, platform data may include a type of integrated circuit 12, a model of the integrated circuit 12, as well as operating characteristics of the integrated circuit 12. Similarly, the platform data may also include the type of processor 76, a model of the processor 76, as well as operating characteristics of the processor 76. The platform data may also include other hardware information regarding the system 70, such information regarding a heat sink to be used to cool the integrated circuit 12. For instance, the platform data may include information regarding a model of a heat sink as well as a type of thermal management provided by a heat sink (e.g., a heat sink with or without a fan or a heat sink that employs liquid cooling). Additionally, the platform data may include information regarding an environment in which the system 70 will be operated. For instance, an expected ambient temperature of the environment in which the system 70 will be located when operating may be included in the platform data. Moreover, the platform data may include an expected airflow of the environment in which the system will be located when operating.

In some embodiments, the platform data may be obtained based on user input. For instance, the design software 14 may include an interface that allows for the designer to input the model of the integrated circuit 12, the processor 76, information regarding other hardware such as a heat sink to be integrated with the integrated circuit 12, as well as information regarding the environment in which the system 70 may operate, such as an expected ambient temperature. For instance, the design software 14 may provide drop-down boxes that allow for designer to select or otherwise provide information regarding the system 70.

Figure 9:
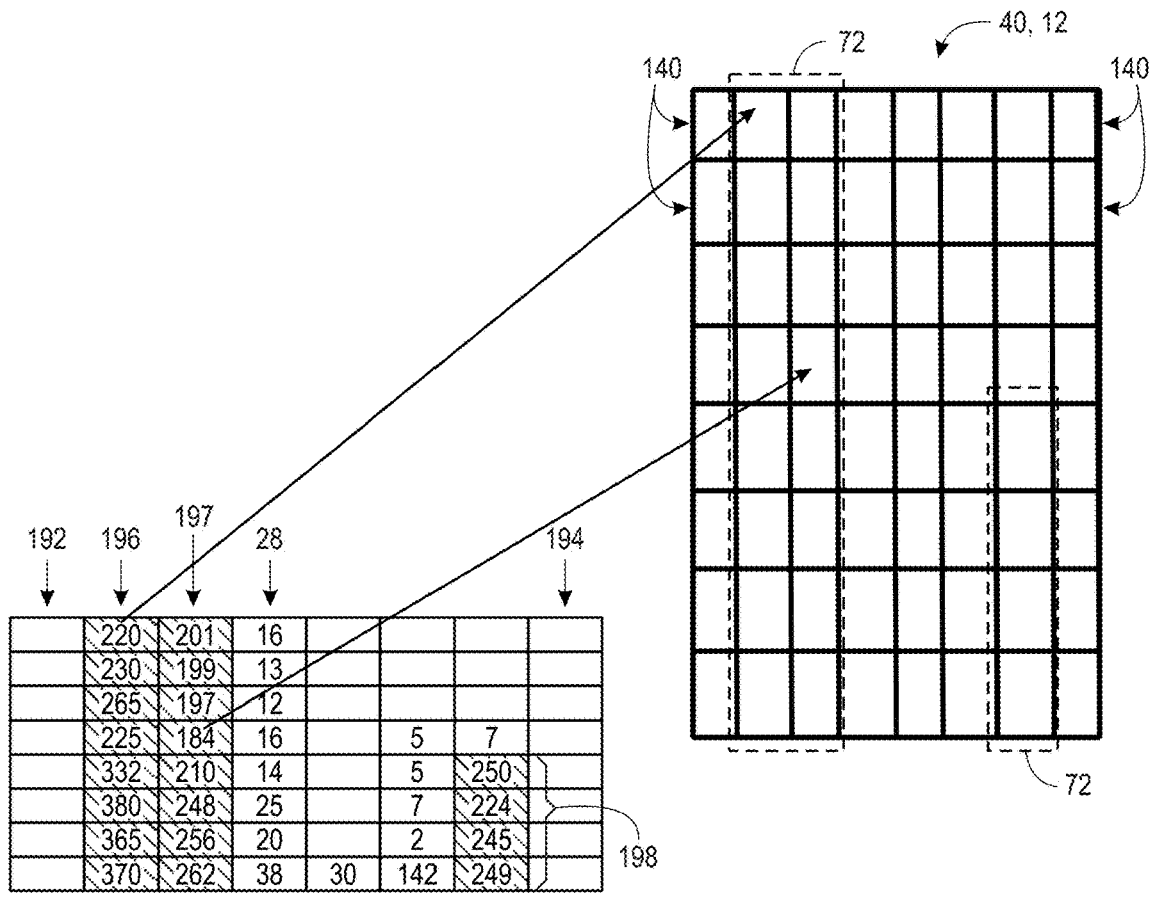
FIG. 9 is a diagram of a power map and its relationship to an integrated circuit, in accordance with an embodiment of the present disclosure.
Figure 10:
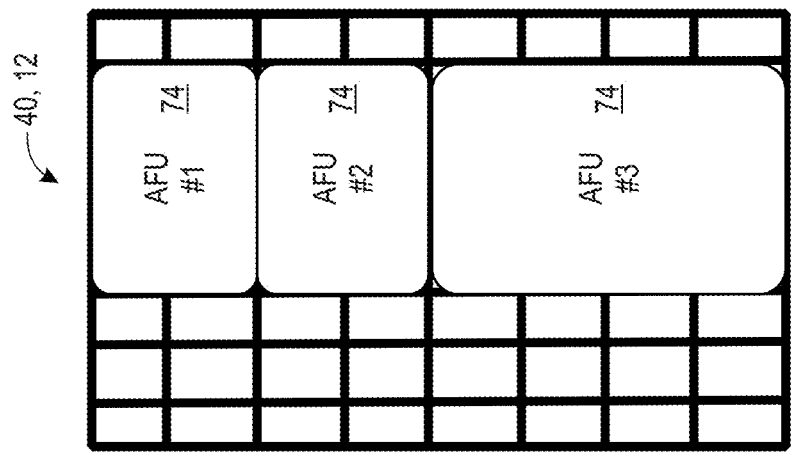
FIG. 10 is diagrams of several embodiments of an integrated circuit, in accordance with embodiments of the present disclosure.
Figure 10:
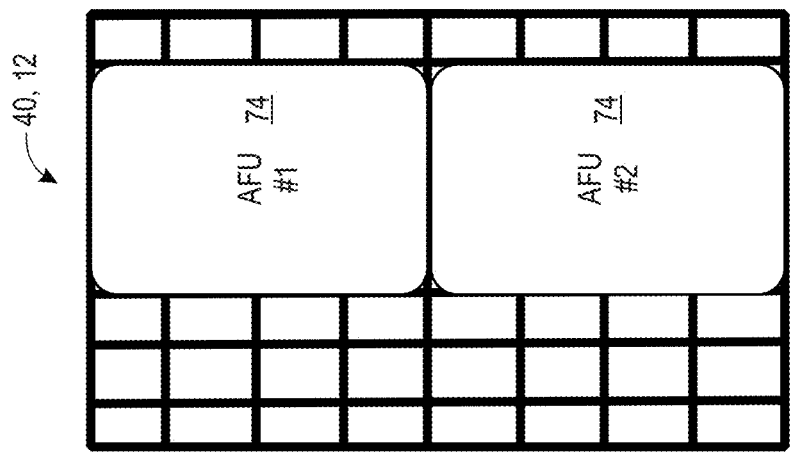
Figure 10:
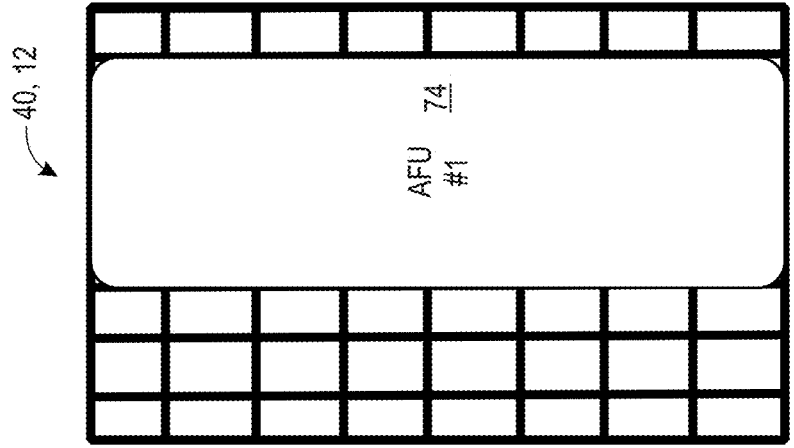

Before continuing with the discussion of the process 120, it should be noted that the power map 28 may include ranges of power consumption values. For instance, while one value may be given (e.g., as illustrated in FIG. 9 and FIG. 11), such a value may be the value that has a higher probability of being the amount of consumed power as compared to other amounts of consumed power. Multiple values may be used instead to provide a range of power consumption values. The range may be used to take into account different potential values of a, whether performance of the FPGA 40 is more likely to be associated with typical operation or a maximum power consumption condition, variations in environmental temperature or operation of a heat sink or cooling system associated with the FPGA 40, or a combination thereof.

Returning to FIG. 5, at block 132, the processor 32 may determine an incidence coefficient matrix (ICM) based on the platform data. The ICM generally describes a relationship between power consumed by the FPGA 40 and expected amounts of heat that is generated by the FPGA 40. The ICM takes into account design details concerning the FPGA 40 (e.g., transceiver blocks 140, static region 72, and partial reconfiguration regions 74) as well as the platform data (e.g., information regarding a heat sink used to cool the FPGA 40). The ICM may also be determined based on other information, such as transceiver power, default static power, static region dynamic power, and the like.

At block 134, the processor 32 may determine a heat factor. The heat factor is a value or series of values that describes how efficiently or inefficiently the system 70 will be at removing heat from the FPGA 40. Additionally, the heat factor describes an amount of heat expected to be generated by the consumption of electrical power of the FPGA 40. In other words, the heat factor may provide an indication of the amount of heat will be generated by FPGA 40 during operation. The processor 32 may determine the heat dissipation factor based on the platform data. For example, the measure of the amount of heat that may be generated by the FPGA 40 as well as an amount of heat that may be dissipated (e.g., by a heat sink) may be determined based on the FPGA 40 (e.g., a model of the FPGA 40, how the FPGA 40 has been programmed, physical components of the FPGA 40), other components associated with the FPGA 40, such as a cooling system or heat sink, and the environment in which the FPGA 40 will be located (e.g., expected ambient temperature).

At block 136, the processor 32 may generate the power map 28. As discussed above, the power map 28 is indicative of the expected power to be consumed by the FPGA 40. For example, the power map 28 may indicate an expected amount of power associated with each sector 48 of the FPGA 40. The power map 28 can correspond to a particular junction temperature, and the processor 32 may generate several power maps 28, each of which pertain to a specific junction temperature value. Additionally, the power map 28 may be indicative of the power used by each sector 48 of the FPGA 40 as well as each region, such as the static region 72 and the partial reconfiguration regions 74 (e.g., via summation of power consumption values associated with sectors 48 that are included in a particular region of the FPGA 40).

At block 138, the processor 32 may generate a heat map 30. The heat map 30 may be generated based on the power map 28, platform data, the ICM, and the heat factor. In other words, for a particular hardware configuration (e.g., a particular integrated circuit to be employed, the hardware implementation described by the kernel program (bitstream) 20, and a degree of cooling and/or heat dissipation to be provided (e.g., by a cooling system or heat sink)), the environment in which the integrated circuit will be operated (e.g., expected ambient temperature), and how the integrated circuit 12 (e.g., FPGA 40) will be used (e.g., as described by activity factor α), and a relationship between power and temperature (e.g., as described by the heat factor), the processor 32 may generate the heat map 30.

Figure 12:
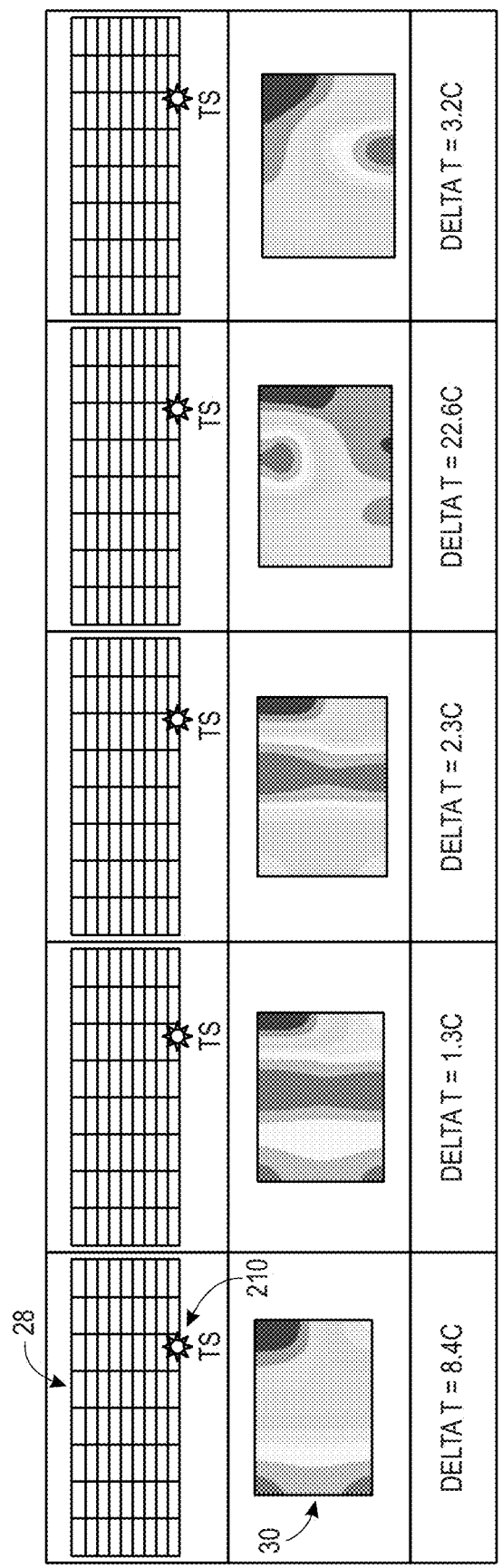
FIG. 12 is diagrams of power maps and heat maps associated with various operating scenarios of an integrated circuit, in accordance with an embodiment of the present disclosure.

With this in mind, FIG. 12 includes the power maps 28 and the heat maps 30 that are associated with various scenarios. For example, each of the illustrated power maps 28 and heat maps 30 associated with various potential operating scenarios the FPGA 40 may encounter after the hardware implementation described by the kernel program (bitstream) 20 is employed by the FPGA 40. As illustrated, the power maps 28 show where a temperature sensor 210 may be located. Although the temperature sensor 210 may be positioned in an area of the FPGA 40 that is associated with the partial reconfiguration regions 74, in other embodiments, the temperature sensor 210 may be positioned elsewhere on the FPGA 40. Moreover, in other embodiments, more than one temperature sensor 210 may be used. The temperature sensor 210 may collect data of a temperature around the temperature sensor 210. Additionally, the temperature sensor 210 may be communicatively coupled to the FPGA 40, the processor 76, or both the FPGA 40 and the processor 76.

During operation of the system 70, the processor 76 may determine a temperature difference between a junction temperature of the FPGA 40 and a temperature detected by the temperature sensor 210. For example, as shown in FIG. 12, each heat map 30 is associated with a value for "Delta T," which is a difference between the temperature sensed by the temperature sensor 210 and the junction temperature of the FPGA 40. For example, the heat map 30 may indicate a temperature associated with each sector 48 of the FPGA 40. One sector 48 may be associated with one temperature value according to the heat map 30, while the temperature sensor 210 may measure another temperature value for the same sector 48. The "Delta T" reflects the difference between two such values. Additionally, it should be noted that before the kernel program (bitstream) 20 is implemented into the FPGA 40, the temperature value used to determine the temperature difference (i.e., Delta T) may be a predicted value calculated by the processor 32.

As described above, a hardware implementation described by the kernel program (bitstream) 20 may be incorporated by the integrated circuit 12 (e.g., the FPGA 40). The power maps 28 and heat maps 30 may be refined after incorporation of the hardware implementation. More specifically, and as described below, the processor 76 may update the power maps 28 and heat maps 30 based on detected power values and by comparing the determined values to expected values used to generate the power maps 28 and heat maps 30. In other words, while the power maps 28 and heat maps 30 generated by the processor 32 may be estimates, data specific to the FPGA 40 may be obtained after implementation of the kernel program (bitstream) 20, and the processor 76 may update the power maps 28 and heat maps 30 based on the collected data.

Figure 13:
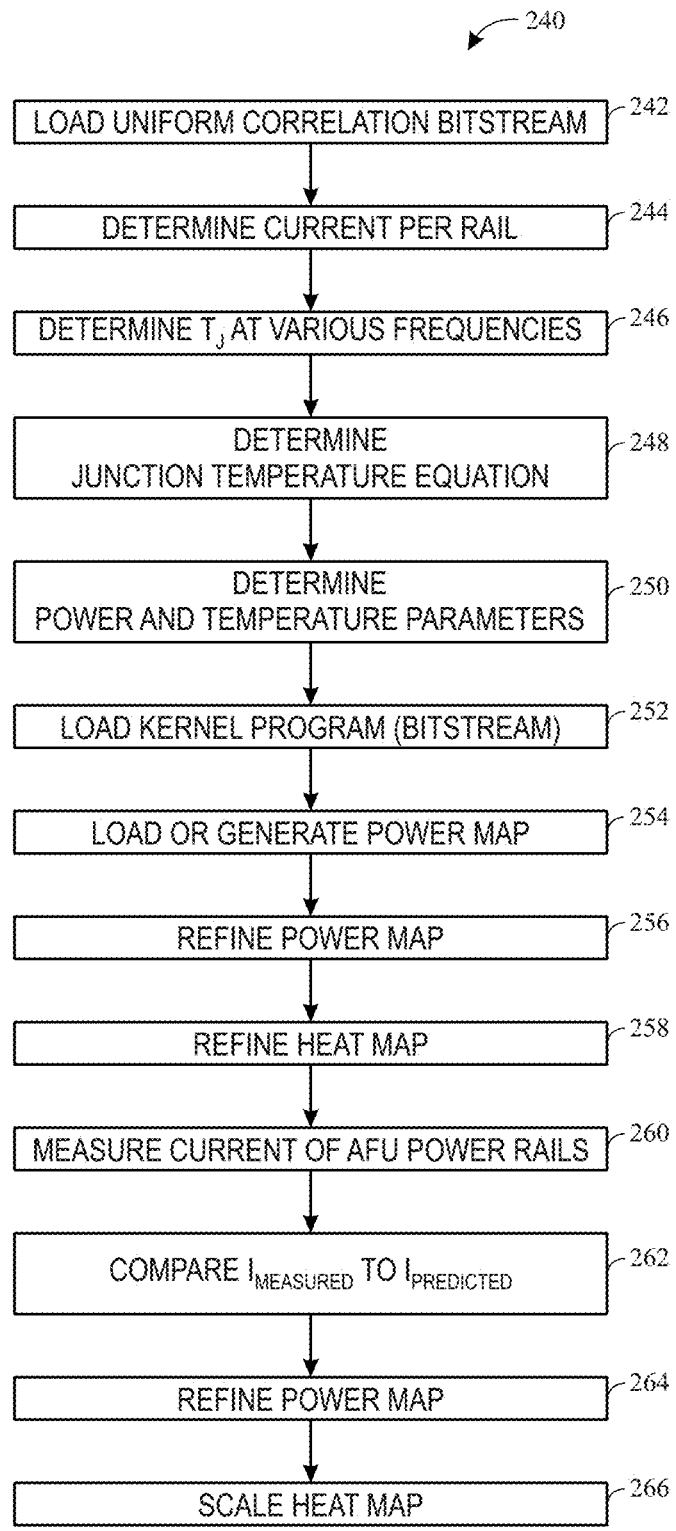
FIG. 13 is a flow chart of a process of refining power maps and heat maps, in accordance with an embodiment of the present disclosure.

With the foregoing in mind, FIG. 13 is a flow chart of a process 240 for refining power maps 28 and heat maps 30. In brief, the processor 76 may implement a particular hardware into the FPGA 40 that includes a known arrangement of circuit components that are programmed to perform certain operations. As such, the processor 76 may have the value of the activity factor, which may be a uniform value for each AFU. While operating the AFUs on the FPGA 40, the processor 76 may obtain power consumption and heat values to make boundary conditions for power and heat estimates regarding the operations of the FPGA 40.

At a later time, the processor 76 may receive a design to incorporate another hardware implementation for the FPGA 40. As such, the processor 76 may update the estimates for portions of the power map 28 and the heat map 30 that correspond to the AFUs based on the previous power and heat measurements during the loading (e.g., about 50 milliseconds) of the hardware implementation. As the AFUs of the FPGA 40 perform their respective tasks, the processor 76 may take additional electrical and temperature measurements and dynamically adjust the power map 28 and the heat map 30 to represent the current operations of the FPGA 40.

Referring now to the details of FIG. 13, at block 242, a first kernel program (bitstream) 20 that may include a uniform correlation bitstream may be loaded and implemented by the FPGA 40. It should be noted that the first kernel program 20 associated with block 242 may differ from the second kernel program 20 mentioned below. More specifically, the first kernel program 20 may describe a hardware implementation for the partial reconfiguration regions 74 that differs from the hardware implementation described by the second kernel program 20 used to program the FPGA 40 to perform certain desired operations by a designer. In one embodiment, the first kernel program 20 may include a hardware implementation that is known. For instance, incorporation of the hardware implementation described by the first kernel program 20 may result in the CRAM of the partial reconfiguration regions 74 to be programmed to perform certain known operations. For example, the value of the activity factor, $\alpha$, may be known for each sector 48 of the partial reconfiguration regions included in the first kernel program 20. As such, portions of power maps 28 and heat maps 30 associated with the hardware configuration of the first kernel program 20 may be generated as a baseline or reference for the processor 76. With the first kernel program 20 implemented, as described below with respect to blocks 244, 246, 248, and 250, the processor 76 may make several determinations (e.g., power consumption, current per rail, junction temperature) that are specific to the FPGA 40. These determinations may be used to refine to the power maps 28 and heat maps 30.

At block 244, the processor 76 may measure current values for each rail of the FPGA 40. That is, current values associated with voltage rails that deliver power to the FPGA 40 may be measured. For instance, the FPGA 40 may be controlled by the processor 76, which may command the FPGA 40 to operate with certain operational characteristics. For example, the processor 76 may cause the partial reconfiguration regions 74 to operate at a maximum output level. The processor 76 may detect current values associated with power delivered via voltage rails to the various portions of the FPGA 40, such as the transceiver banks 140, static region 72, and partial reconfiguration regions 74. As described below, the current measurements may be used to calculate measured power values, and the measured power values may be compared to expected power values.

At block 246, the processor 76 may measure junction temperature values of the FPGA 40 at various maximum operating frequencies based on the temperature value received from the temperature sensor 210 and the heat map 30. For example, the FPGA 40 may be operated in a manner represented by Scenario 2 of FIG. 12 in which each sector 48 of the partial reconfiguration regions 74 of the FPGA 40 is operated at a specific frequency or maximum frequency. The junction temperature may be determined by the processor 76 by utilizing data from the temperature sensor 210 as well as by referencing a heat map 28 associated with the kernel program 20 loaded onto the FPGA 40 at block 242. For example, a junction temperature may be determined at frequency values of 100, 200, and 300 megahertz. In other embodiments, different frequency values may be used, more frequency values may be used, and the difference between two frequency values may differ. For instance, junction temperature values may be measured at frequencies of 50, 100, 150, 200, 250, 300, and 350 megahertz.

Based on the determined junction temperature values, at block 248, the processor 76 may generate an equation defining junction temperature as a function of frequency and the activity factor, $\alpha$. For example, when the activity factor has a constant value—which, as mentioned above, may be the case when using the first kernel program—the junction temperature values measured at various frequencies may be used to determine an equation for junction temperature based on frequencies.

At block 250, the processor 76 may determine parameters that allow for more accurate power and temperature determinations to be made. More specifically, the processor 76 may determine a $T_j$-max parameter. The $T_j$-max parameter may be used to obtain a maximum junction temperature for different power values. The power values can be obtained based on frequencies (e.g., there is a known amount of power or a range of power values associated with a particular frequency) in which certain sectors 48 operate. So, for a given frequency, one may set a maximum error range of sorts for the calculated temperature values.

At block 252, the second kernel program (bitstream) 20 may be loaded onto the FPGA 40. In other words, the hardware implementation described by the second kernel program (bitstream) 20 is incorporated onto the FPGA 40. Based on the power and temperature data gleaned from the operation of the first kernel program 20, the power and temperature properties of the integrated circuit 12 during operation of other kernel programs may be more accurately determinable. By way of example, the other kernel programs may include a second kernel program 20 that may be developed by an end user of the FPGA 40.

At block 254, the power map 28 for the first kernel program 28 may be loaded (e.g., accessed) or generated by the processor 76. For example, the power map 28 may, as described above, be generated by the processor 76. The power map 28 may also be stored on the memory 78 and accessible by the processor 76. In other embodiments, the processor 76 may generate the power map 28.

At block 256, the power map 28 may be refined (e.g., scaled) based on the parameters generated at block 250 as well as measured values (e.g., current measured at block 244). Regarding measured values, such as current values, the processor 76 may determine an amount of power utilized by a power rail. For example, electrical power with a known voltage (e.g., determined via a voltage regular or fully-integrated voltage regulator) may have been used at block 244. With the known voltage and current values, the processor 76 may determine an amount of power for each power rail.

The processor 76 may modify the power map 28 based on a comparison of the determined amount of power and an expected amount of power. In other words, the processor 76 may modify previously generated power maps 28 based on the chip-specific determinations made in blocks 244, 246, 248, and 250. More specifically, the known power values for a given power rail may be compared to the values associated with the power map 28, and the power map 28 may be refined based on such a comparison. For instance, when power values for a power rail differ from predicted values by a threshold amount (e.g., a percentage value or an amount of power), the power map 28 may be modified to reflect power values that are more similar to those that were determined based on data obtained from the FPGA 40. Moreover, to account for the possibility that more than one AFU may be tracked at a given point in time, in some instances, such learning may be performed with an individual AFU in isolation (e.g., while the other AFUs disabled or not loaded (e.g., for the purpose of isolating the power and/or activity factor of a specific AFU)). Such empirical calculations could also incorporate the statistical distribution of power (e.g. min, max, mean, variance) or other factors such as power as a function of the input rate (i.e., amount of data supplied to an AFU), operating mode of the AFU, or other exogenous information. Such considerations may be incorporated into the estimation of power for an AFU at a given point in time, and could incorporate probabilistic averaging when many AFUs are active on a given integrated circuit (e.g., FPGA 40).

At block 258, the processor 76 may refine the heat map 30 based on the refined power map 28. In other words, because the heat map 30 is generated based on the power map 30, changes to the power map 28 (e.g., due to refinement) may cause the power map 30 to be altered.

It should be noted that the operations performed at blocks 254, 256, 258 may be performed while the second kernel program (bitstream) 20 is loaded onto the FPGA 40. That is, during implementation of the second kernel program (bitstream) 20, the previously generated power map 28 may be refined. Additionally, the heat map 30 may be refined based on the refined power map 28.

The power maps 28 and heat maps 30 may continue to be refined during operation of the system 70. That is, as the FPGA operates 40, the processor 76 may make adjustments to the power maps 28 and heat maps 30. For instance, as part of the refinement, the processor 76 may determine a value for the activity factor α for each accelerator functional unit of the partial reconfiguration regions 74 based on electrical power data. Such a determination may be made after the second kernel program (bitstream) 20 has been loaded onto the FPGA 40 or after a portion of the second kernel program (bitstream) 20 has been loaded onto the FPGA 40. For instance, a value for the activity factor α for a given accelerator functional unit may be determined when no other accelerator functional units have been loaded onto the FPGA 40.

Continuing with the discussion of the process 240, at block 260, the processor 76 may determine the current for the power rails that supply power to the partial reconfiguration regions 74. At block 262, the processor 76 may compare measured current values to expected current values. For example, the processor 76 may determine expected current values for a power rail based on the voltage of electrical power to be delivered to a particular power rail. Alternatively, the processor 76 may compare a measured power value, which can be determined based on a measured current value and a known voltage values (e.g., a value obtained from a voltage regulator for a power rail), to an expected power value.

At block 264, the processor 76 may refine the power map 28 based on the comparison performed at block 262. For example, when the measured power differs from an expected amount of power, the processor 76 may refine the power maps 28. More specifically, because during operation of the FPGA 40, values of frequency, voltage, and capacitance are determinable, and thus, known, the processor 76 may determine that value of the activity factor, α. The power maps 28 may be refined by the processor 76 using the calculated activity factor in the determination of a new expected power. That is, the processor 76 may modify the power maps 28 to more closely reflect power values actually experienced by the FPGA 40. Similarly, at block 266, the processor 76 may refine the heat maps 30 based on the refined power maps 28. For instance, the updated expected power values may be used to determine temperature values.

Figure 14:
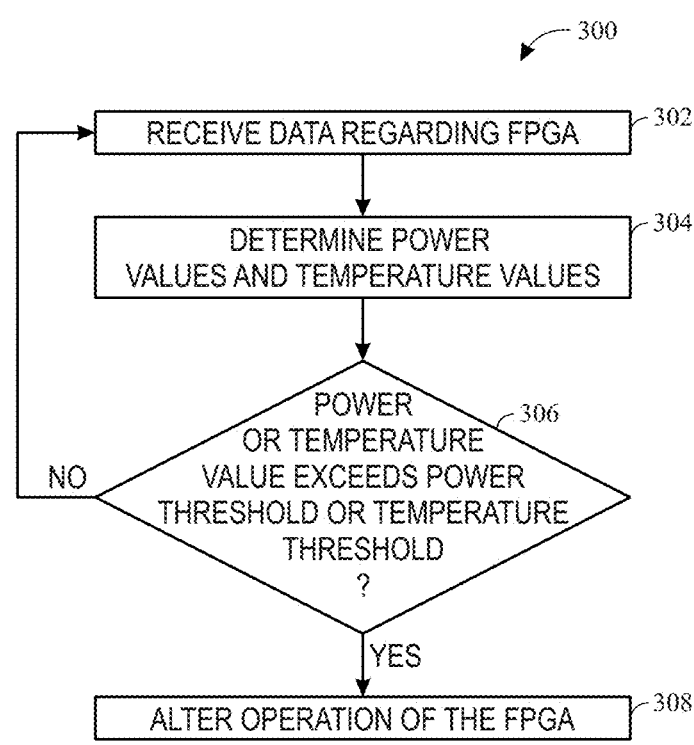
FIG. 14 is a flow chart of a process for controlling operation of an integrated circuit, in accordance with an embodiment of the present disclosure.

Furthermore, the processor 76 may alter the performance of the FPGA 40 based on data collected during operation of the system 70. Altering the performance of the FPGA may include changing a frequency (e.g., clock speed) of a partial reconfiguration 74, changing a data rate at which input is supplied to a partial reconfiguration 74, changing or limiting an availability of a partial reconfiguration 74 to peripherals such as memory bandwidth, or another mechanism that may change an amount of power consumed by a partial reconfiguration 74. With this is mind, FIG. 14 is a flow chart of a process 300 for controlling operation of the FPGA 40. The process 300 may be performed by the processor 76 or other suitable processing circuitry.

At block 302, the processor 76 may receive data from and/or regarding the FPGA 40. For example, the processor 76 may receive current values associated with power rails, voltage values from a voltage regulator, and data associated with the FPGA 40, such as heat maps 28, power maps 30, and information about the FPGA 40 (e.g., type of FPGA, hardware implementation as indicated by the kernel program (bitstream) 20).

At block 304, the processor 76 may determine power values and temperature values associated with the FPGA 40. For example, the processor 76 may determine power values associated with each power rail as well as each of the partial reconfiguration regions 74 of the FPGA. For example, each partial reconfiguration region 74 may be powered by one or more specific power rails, and the processor 76 may determine the power associated with those rails. Similarly, based on power consumption as well as detected temperature values from the heat sensor 210, the processor 76 may determine temperatures associated with portions of the FPGA (e.g., sectors 48 and/or partial reconfiguration regions 74) as well as temperature differences between the temperatures reflected by the temperature sensor 210 and predicted temperatures of the various sectors 48 and/or regions (e.g., partial reconfiguration regions 74) of the FPGA 40.

At block 306, the processor 76 may determine whether a partial reconfiguration region 74 is consuming an amount of power that surpasses a threshold amount of power. For example, the threshold amount of power may be an amount of power predicted by a power map 28 or a specific percentage value above about the amount of power predicted by the power map 28 (e.g., 10%, 20%, 25% or any other suitable percentage value). Additionally, or alternatively, the processor 76 may determine whether a temperature value associated with a portion of the FPGA 40 (e.g., a sector 48 or partial reconfiguration region 74) exceeds a threshold. Similar to the power values, the threshold temperature may be a temperature difference between a predicted temperature (e.g., as indicated by the heat map 30) and a temperature indicated by the temperature sensor 210 or determined according to the description provided above. When neither the power threshold not the temperature threshold is exceeded, the processor 76 may return to block 302 and receive data regarding the FPGA 40.

However, when more than one partial reconfiguration region 74 exceeds a threshold, the processor 76 may proceed to block 308 and alter the operation of one or more of the partial reconfiguration regions 74. For example, the processor 76 may alter operation of the partial reconfiguration region 74 that most exceeds a threshold, such that the partial reconfiguration region 74 operates below the threshold.

The processor 76 may alter operation of a partial reconfiguration region 74 in several ways. For example, the processor 76 may throttle a clocking frequency for the partial reconfiguration region 74. That is, the processor 76 may cause a frequency at which the partial reconfiguration region 74 is operating to decrease. Such a decrease would cause the partial reconfiguration region 74 to use less power and generate less heat. As yet another example, the processor 76 may cause the partial reconfiguration region 74 to stop performing. That is, the processor may force the partial reconfiguration region 74 to refrain from performing an operation or cause the partial reconfiguration region 74 to power down. Other examples of actions the processor changing a data rate at which input is supplied to the partial reconfiguration 74 and changing or limiting an availability of the partial reconfiguration 74 to peripherals such as memory bandwidth.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS OF THE DISCLOSURE

The following numbered clauses define certain example embodiments of the present disclosure:

CLAUSE 1. A heat management system, comprising:
a programmable logic device (PLD); and
a first processor communicatively coupled to the PLD, wherein the first processor is configured to:
determine a first set of power values for a first set of portions of a plurality of portions of the PLD based on one or more transceivers implemented via hardware on the PLD based on a first design of the PLD;
determine a second set of power values for a second set of portions of the plurality of portions based on a junction temperature associated with the PLD;
determine a third set of power values for a third set of portions of the plurality of portions configured to perform one or more operations for the PLD, wherein the third set of power values correspond to a set of expected power consumption values when the third set of portions is performing the one or more operations;
determine a temperature value for each portion of the plurality of portions of the PLD based on the first set of power values, second set of power values, the third set of power values, and platform data associated with the PLD; and
generate a power map indicative of an expected power value for each portion of the plurality of portions based on the first set of power values, second set of power values, and the third set of power values; and
generate a heat map indicative of an expected temperature value for each portion of the plurality of portions.

CLAUSE 2. The heat management system of clause 1, wherein the PLD comprises a field programmable gate array (FPGA).

CLAUSE 3. The heat management system of clause 1 or 2, wherein the first processor is configured to determine:
a fourth set of power values for the second set of portions of the plurality of portions based on an expected activity of one or more hardware components in the second set of portions when the one or more hardware components are performing an operation; and
determine the temperature value for each portion of the plurality of portions of the PLD based on the first set of power values, second set of power values, the third set of power values, the fourth set of power values, and the platform data associated with the PLD.

CLAUSE 4. The heat management system of clause 1, 2, or 3, wherein the platform data comprises information regarding a heat sink, an expected airflow, or an expected ambient temperature.

CLAUSE 5. The heat management system of clause 1, 2, 3, or 4, comprising a second processor configured to control a set of operations of the PLD, wherein the second processor is configured to control the set of operations in response to at least one expected power value of the power map associated with at least one portion of the plurality of portions exceeding at least one respective power threshold value.

CLAUSE 6. The heat management system of clause 5, wherein the at least one respective power threshold value corresponds to an expected power consumption value associated with the respective at least one portion of the plurality of portions during operation of the PLD.

CLAUSE 7. The heat management system of clause 1, 2, 3, or 4, comprising a second processor configured to control a set of operations of the PLD, wherein the second processor is configured to control the set of operations in response to at least one the temperature value of the heat map associated with at least one portion of the plurality of portions exceeding at least one respective temperature threshold value.

CLAUSE 8. The heat management system of clause 1 or 2, wherein the temperature value for each portion of the plurality of portions is determined at least partially based on a respective power value associated with a respective portion of the plurality of portions.

CLAUSE 9. The heat management system of clause 1 or 2, wherein the third set of portions of the plurality of portions corresponds to at least one partial reconfiguration region of the PLD.

CLAUSE 10. A heat management system, comprising:
a field programmable gate array (FPGA) comprising configuration memory, a plurality of transceiver blocks, and a plurality of portions, wherein the plurality of portions comprises at least one static region and at least one partial reconfiguration region;
a temperature sensor configured to detect a temperature associated with a portion of the plurality of portions; and
a first processor communicatively coupled to the FPGA, wherein the processor is configured to:
receive a power map of the FPGA, wherein the power map is indicative of a plurality of expected amounts of power of the plurality of portions;
receive a heat map of the FPGA, wherein the heat map is indicative of a plurality of expected temperature values of the plurality of portions;
receive temperature data associated with the portion of the plurality of portions from a temperature sensor during the operation of the FPGA;
receive current data associated with one or more power rails configured to couple to the FPGA, wherein the current data represents one or more amounts of current present on the one or more power rails during the operation of the FPGA;
refine the power map based on the current data; and
refine the heat map based on the current data.

CLAUSE 11. The heat management system of clause 10, wherein the processor is configured to refine the power map based on a difference between a current value associated with one of the plurality of portions according to the power map and one of the one or more amounts of current.

CLAUSE 12. The heat management system of clause 10 or 11, wherein the processor is configured to:
receive one or more values associated with frequency and voltage associated with the FPGA; and
refine the power map based on the current data and the one or more values.

CLAUSE 13. The heat management system of clause 10, 11, or 12, wherein the processor is configured to control a set of operations of the FPGA in response to a difference between at least one of the expected temperature values of the heat map associated with at least one portion of the plurality of portions and the temperature detected by the temperature sensor exceeding a threshold.

CLAUSE 14. The heat management system of clause 10, 11, 12, or 13, wherein the heat map and the power map are generated by a second processor separate from the first processor.

CLAUSE 15. A method for operating a field programmable gate array (FPGA), the method comprising:
receiving, via a processor, a power map of a FPGA, wherein the power map is indicative of a plurality of expected amounts of power of a plurality of portions of the FPGA;
receiving, via the processor, a heat map of the FPGA, wherein the heat map is generated based at least partially on the power map, and wherein the heat map is indicative of a plurality of expected temperature values of the plurality of portions;
receiving, via the processor, power data associated with one or more power rails configured to couple to the FPGA, wherein the power data represents one or more amounts of current present on the one or more power rails during an operation of the FPGA; and
determining, via the processor, a plurality of amounts of power of the plurality of portions of the FPGA based on the power data;
determining, via the processor, whether at least one of the plurality of amounts of power exceeds a respective power threshold associated at least one portion of the plurality of portions; and
altering, via the processor, at least one operation of the at least one portion in response to the at least one of the amounts of power exceeding the respective power threshold.

CLAUSE 16. The method of clause 15, wherein the respective power threshold corresponds to a value greater than an expected amount of power of the plurality of expected amounts of power.

CLAUSE 17. The method of clause 15 or 16, comprising:
receiving, via the processor, temperature data associated with a portion of the plurality of portions from a temperature sensor during the operation of the FPGA;
determining, via the processor, whether the temperature data exceeds a respective temperature threshold associated with the at least one portion; and
altering, via the processor, the at least one operation in response to the temperature data exceeding the respective temperature threshold.

CLAUSE 18, The method of clause 17, comprising:
determining, via the processor, a temperature associated with the at least one portion based on the power data; and
determining whether the temperature data exceeds the respective temperature threshold when the temperature associated with the at least one portion exceeds the respective temperature threshold.

CLAUSE 19. The method of clause 15 or 16, wherein the processor is configured to alter operation of the at least one portion by stopping the operation of the at least one portion.

CLAUSE 20. The method of clause 15 or 16, wherein the processor is configured to alter operation of the at least one portion by reducing an operating frequency of the at least one portion.

CLAUSE 21. A non-transitory, computer-readable medium comprising instructions that, when executed by one or more processors, cause the one or more processors to:
determine a plurality of power values for a plurality of portions of the PLD based on a design of the PLD, a junction temperature associated with the PLD, and an expected amount of power consumption associated with the PLD;
generate a temperature value for each portion of the plurality of portions of the PLD based on the plurality of power values and platform data associated with the PLD;
generate a power map indicative of an expected power value for each portion of the plurality of portions based on the plurality of power values; and
generate a heat map indicative of an expected temperature value of each portion of the plurality of portions.

CLAUSE 22. The non-transitory, computer-readable medium of clause 21, wherein the instructions are configured to cause the one or more processors to:
receive temperature data associated with a first portion of the plurality of portions from a temperature sensor during the operation of the PLD;
receive current data associated with one or more power rails configured to couple to the PLD, wherein the current data represents one or more amounts of current present on the one or more power rails during the operation of the PLD;
refine the power map based on the current data; and
refine the heat map based on the current data.

CLAUSE 23. The non-transitory, computer-readable medium of clause 22, wherein the instructions are configured to cause the one or more processors to alter an operation of the PLD based on the heat map.

CLAUSE 24. The non-transitory, computer-readable medium of clause 21, 22, or 23, wherein the plurality of power values comprises a first set of power values associated with a first portion of the plurality of portions, wherein the first portion corresponds to a partial reconfiguration region.

CLAUSE 25. The non-transitory, computer-readable medium of clause 21, 22, 23, or 24, wherein the PLD comprises a field programmable gate array (FPGA).

What is claimed is:
1. A system, comprising:
a programmable logic device (PLD); and
a first processor communicatively coupled to the PLD, wherein the first processor is configured to:
determine a first set of power values for a first set of portions of a plurality of portions of the PLD based on one or more transceivers implemented via hardware on the PLD based on a first design of the PLD;
determine a second set of power values for a second set of portions of the plurality of portions based on a junction temperature associated with the PLD;
determine a third set of power values for a third set of portions of the plurality of portions configured to perform one or more operations for the PLD, wherein the third set of power values correspond to a set of expected power consumption values when the third set of portions is performing the one or more operations, wherein the third set of portions corresponds to at least one partial reconfiguration region of the PLD;

determine a temperature value for each portion of the plurality of portions of the PLD based on the first set of power values, the second set of power values, the third set of power values, and platform data associated with the PLD;

generate a power map indicative of an expected power value for each portion of the plurality of portions based on the first set of power values, the second set of power values, and the third set of power values; and generate a heat map indicative of an expected temperature value for each portion of the plurality of portions.

2. The system of claim 1, wherein the PLD comprises a field programmable gate array (FPGA).

3. The system of claim 1, wherein the first processor is configured to determine:

a fourth set of power values for the second set of portions of the plurality of portions based on an expected activity of one or more hardware components in the second set of portions when the one or more hardware components are performing an operation; and determine the temperature value for each portion of the plurality of portions of the PLD based on the first set of power values, second set of power values, the third set of power values, the fourth set of power values, and the platform data associated with the PLD.

4. The system of claim 1, wherein the platform data comprises information regarding a heat sink, an expected airflow, or an expected ambient temperature.

5. The system of claim 1, comprising a second processor configured to control a set of operations of the PLD, wherein the second processor is configured to control the set of operations in response to at least one expected power value of the power map associated with at least one portion of the plurality of portions exceeding at least one respective power threshold value.

6. The system of claim 5, wherein the at least one respective power threshold value corresponds to an expected power consumption value associated with the at least one portion of the plurality of portions during operation of the PLD.

7. The system of claim 1, comprising a second processor configured to control a set of operations of the PLD, wherein the second processor is configured to control the set of operations in response to at least one the temperature value of the heat map associated with at least one portion of the plurality of portions exceeding at least one respective temperature threshold value.

8. The system of claim 1, wherein the temperature value for each portion of the plurality of portions is determined at least partially based on a respective power value associated with a respective portion of the plurality of portions.

9. A system, comprising:

a field programmable gate array (FPGA) comprising configuration memory, a plurality of transceiver blocks, and a plurality of portions, wherein the plurality of portions comprises at least one static region and at least one partial reconfiguration region;

a temperature sensor configured to detect a temperature associated with a portion of the plurality of portions; and a processor communicatively coupled to the FPGA, wherein the processor is configured to:

receive a power map of the FPGA, wherein the power map is indicative of a plurality of expected amounts of power of the plurality of portions;

receive a heat map of the FPGA, wherein the heat map is indicative of a plurality of expected temperature values of the plurality of portions; and while the FPGA is operating:

receive temperature data associated with the portion of the plurality of portions from the temperature sensor during the operation of the FPGA;

receive current data associated with one or more power rails configured to couple to the FPGA, wherein the current data comprises one or more amounts of current measured on the one or more power rails during the operation of the FPGA; and control a set of operations of the FPGA in response to a difference between at least one of the expected temperature values of the heat map associated with at least one portion of the plurality of portions and the temperature detected by the temperature sensor exceeding a threshold.

10. The system of claim 9, wherein the processor is configured to refine the power map based on a difference between a current value associated with one of the plurality of portions according to the power map and one of the one or more amounts of current.

11. The system of claim 9, wherein the processor is configured to:

receive one or more values associated with frequency and voltage associated with the FPGA; and refine the power map based on the current data and the one or more values.

12. The system of claim 9, wherein the heat map and the power map are generated by a second processor separate from the processor.

13. A method, comprising:

receiving, via a processor, a power map of a field programmable gate array (FPGA), wherein the power map is indicative of a plurality of expected amounts of power of a plurality of portions of the FPGA; and while the FPGA is operating:

receiving, via the processor, power data associated with one or more power rails configured to couple to the FPGA, wherein the power data comprises one or more amounts of current measured on the one or more power rails during operation of the FPGA;

determining, via the processor, a plurality of amounts of power of the plurality of portions of the FPGA based on the power data;

determining, via the processor, whether at least one of the plurality of amounts of power exceeds a respective power threshold associated with at least one portion of the plurality of portions; and altering, via the processor, at least one operation of the at least one portion in response to the at least one of the plurality of amounts of power exceeding the respective power threshold.

14. The method of claim 13, wherein the respective power threshold corresponds to a value greater than an expected amount of power of the plurality of expected amounts of power.

15. The method of claim 13, comprising:

receiving, via the processor, a heat map of the FPGA, wherein the heat map is generated based at least partially on the power map, and wherein the heat map is indicative of a plurality of expected temperature values of the plurality of portions; and while the FPGA is operating:
   receiving, via the processor, temperature data associated with a portion of the plurality of portions from a temperature sensor during the operation of the FPGA;
   determining, via the processor, whether the temperature data exceeds a respective temperature threshold associated with the at least one portion; and
   altering, via the processor, the at least one operation in response to the temperature data exceeding the respective temperature threshold.

16. The method of claim 15, comprising:
determining, via the processor, a temperature associated with the at least one portion based on the power data; and
determining whether the temperature data exceeds the respective temperature threshold when the temperature associated with the at least one portion exceeds the respective temperature threshold.

17. The method of claim 13, wherein the processor is configured to alter operation of the at least one portion by stopping the operation of the at least one portion.

18. The method of claim 13, wherein the processor is configured to alter operation of the at least one portion by reducing an operating frequency of the at least one portion.

19. The system of claim 9, wherein the processor is configured to refine the power map based on the current data to generate a refined power map.

20. The system of claim 19, wherein the processor is configured to refine the heat map based on the refined power map.

* * * * *